(12) United States Patent
Todd

(10) Patent No.: US 11,244,369 B1
(45) Date of Patent: Feb. 8, 2022

(54) METHOD FOR AUTOMATING DESIGN CENTER PRODUCT SELECTION AND MANAGEMENT

(71) Applicant: Jacob Todd, Spring, TX (US)

(72) Inventor: Jacob Todd, Spring, TX (US)

( * ) Notice: Subject to any disclaimer, the term of this patent is extended or adjusted under 35 U.S.C. 154(b) by 4 days.

(21) Appl. No.: 16/656,950

(22) Filed: Oct. 18, 2019

Related U.S. Application Data

(60) Provisional application No. 62/747,223, filed on Oct. 18, 2018.

(51) Int. Cl.
*G06Q 30/06* (2012.01)
*G06F 30/13* (2020.01)

(52) U.S. Cl.
CPC ......... *G06Q 30/0621* (2013.01); *G06F 30/13* (2020.01); *G06Q 30/0633* (2013.01); *G06Q 30/0641* (2013.01)

(58) Field of Classification Search
CPC .................. G06Q 30/0601–0645; G06F 30/13
See application file for complete search history.

(56) References Cited

U.S. PATENT DOCUMENTS

| | | | | |
|---|---|---|---|---|
| 5,689,705 | A * | 11/1997 | Fino | G06Q 30/02 |
| 2005/0283371 | A1* | 12/2005 | Tiramani | G06Q 50/167 |
| | | | | 705/26.1 |
| 2011/0218772 | A1* | 9/2011 | Bumbalough | G06F 30/13 |
| | | | | 703/1 |
| 2012/0095730 | A1* | 4/2012 | Krebs | G06F 30/13 |
| | | | | 703/1 |
| 2013/0332319 | A1* | 12/2013 | Zuber | G06Q 30/0601 |
| | | | | 705/27.1 |
| 2015/0324940 | A1* | 11/2015 | Samson | G06Q 50/16 |

OTHER PUBLICATIONS

Kimberly Miller Palm, Beach P. "Builders Guard Sales Gadgets that Help Market New Homes." Oakland Tribune, Mar. 9, 2014, p. n/a. ProQuest. Web. Sep. 16, 2021 . (Year: 2014).*

* cited by examiner

*Primary Examiner* — Resha Desai
*Assistant Examiner* — Kennedy Gibson-Wynn
(74) *Attorney, Agent, or Firm* — Leavitt Eldredge Law Firm

(57) ABSTRACT

A method for automating design center product selection includes maintaining a design center database based on input from a builder, the design center database including a options available; providing a buyer interface accessible from a computing device, the buyer interface; receiving one or more selections from the buyer through the buyer interface; creating a purchase order based on a finalized selection from the buyer; creating a summary document accessible to the buyer and to the builder, the summary document having selection photos of a home with the selected options; and assigning a unique identifying code to each of the options, the unique identifying code further being associated with the selected options on the summary document.

1 Claim, 5 Drawing Sheets

METHOD FOR AUTOMATING DESIGN CENTER PRODUCT SELECTION AND MANAGEMENT

BACKGROUND

1. Field of the Invention

The present invention relates generally to design center selection and management systems, and more specifically, to a system and method for utilizing a platform and unique identifying codes for design center selection and management.

2. Description of Related Art

Design center systems are well known in the art and are effective means to provide buyers with customization options when building a new home. For example, FIG. 1 depicts a flowchart 101 of a conventional design center selection and management system, wherein a center (brick and mortar location) is stocked with a plurality of selections, as shown with box 103. These selections can include any variety of possible options for the buyer, such as counter top selections, flooring selections, décor selections, and many more. Generally the buyer will browse through the selections, and pick the options that suit them, as shown with boxes 105, 107. The design center staff will then create a purchase order, as shown with box 109. Once this process is completed, the builder will implement the selections into the custom home, as shown with box 111.

One of the problems commonly associated with system 101 is inefficiency. For example, it is common for this process to take many hours and can further result in mistakes.

Accordingly, although great strides have been made in the area of design center systems, many shortcomings remain.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

Figure 1:
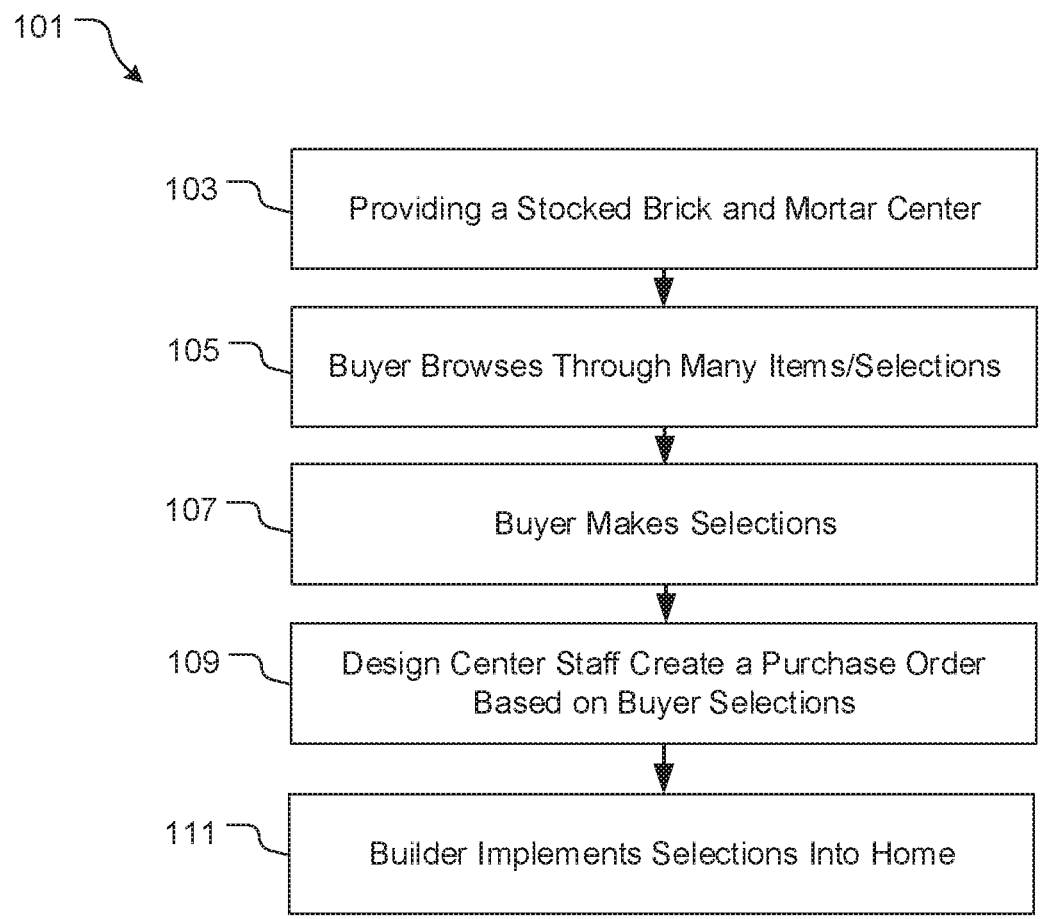
FIG. 1 is a flowchart of method of operation of a common design center system.

While the system and method of use of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application as defined by the appended claims.

DETAILED DESCRIPTION OF THE PREFERRED EMBODIMENT

Illustrative embodiments of the system and method of use of the present application are provided below. It will of course be appreciated that in the development of any actual embodiment, numerous implementation-specific decisions will be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The system and method of use in accordance with the present application overcomes one or more of the above-discussed problems commonly associated with conventional design center systems. Specifically, the present invention provides for a system and method to automate and streamline the selection process, and further reduce the possibility for mistakes during the selection process. These and other unique features of the system and method of use are discussed below and illustrated in the accompanying drawings.

The system and method of use will be understood, both as to its structure and operation, from the accompanying drawings, taken in conjunction with the accompanying description. Several embodiments of the system are presented herein. It should be understood that various components, parts, and features of the different embodiments may be combined together and/or interchanged with one another, all of which are within the scope of the present application, even though not all variations and particular embodiments are shown in the drawings. It should also be understood that the mixing and matching of features, elements, and/or functions between various embodiments is expressly contemplated herein so that one of ordinary skill in the art would appreciate from this disclosure that the features, elements, and/or functions of one embodiment may be incorporated into another embodiment as appropriate, unless described otherwise.

The preferred embodiment herein described is not intended to be exhaustive or to limit the invention to the precise form disclosed. It is chosen and described to explain the principles of the invention and its application and practical use to enable others skilled in the art to follow its teachings.

Figure 2:
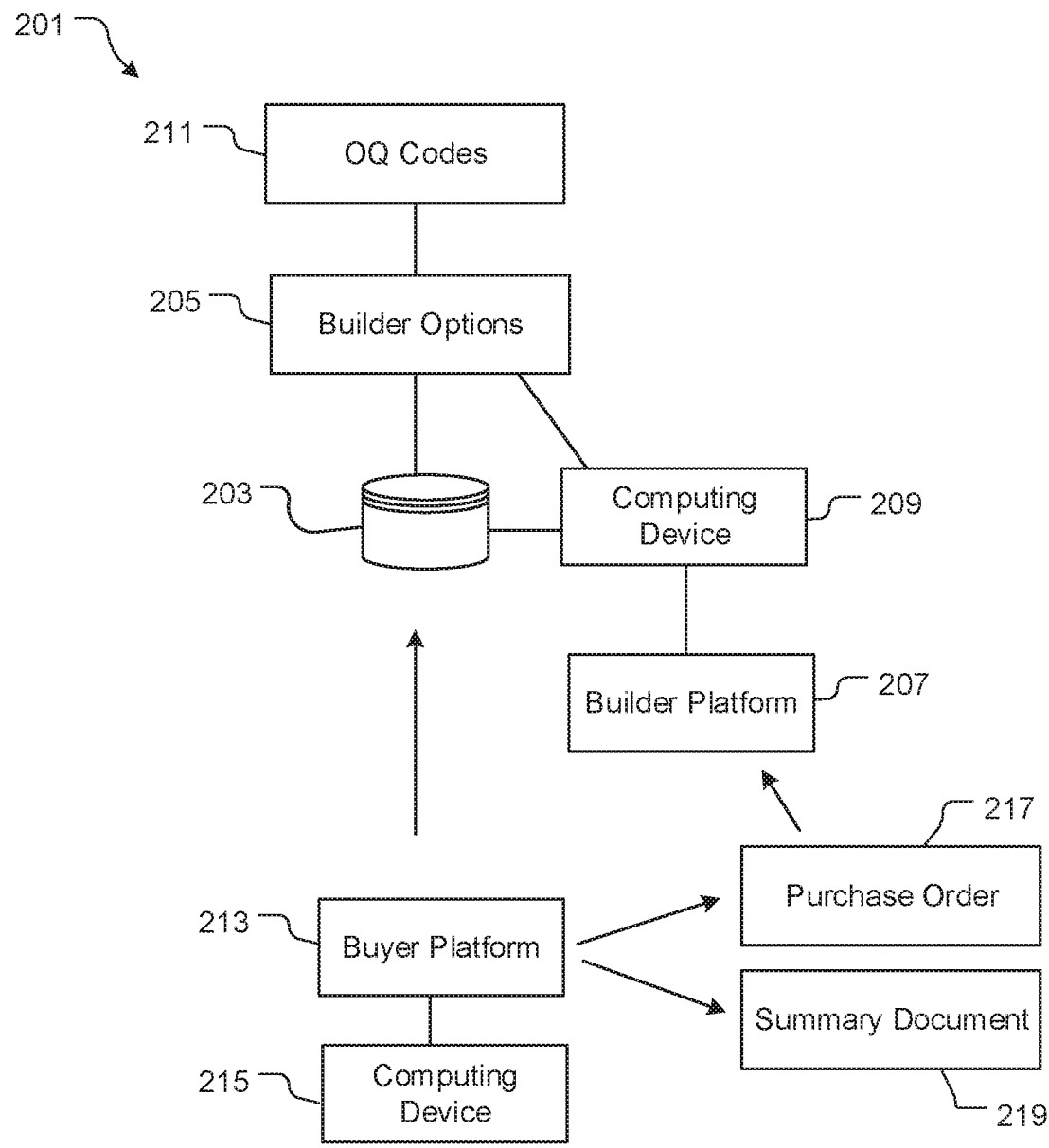
FIG. 2 is a simplified schematic of a system in accordance with a preferred embodiment of the present application.

Referring now to the drawings wherein like reference characters identify corresponding or similar elements throughout the several views, FIG. 2 depicts a simplified schematic of a system 201 in accordance with a preferred embodiment of the present application. It will be appreciated that system 201 overcomes one or more of the above-listed problems commonly associated with conventional design center systems.

In the contemplated embodiment, system 201 includes a database 203 having a plurality of builder options 205 input therein from a builder through a builder platform 207 and computing device 209. It should be appreciated that the builder imports any number of formats, building plans, upgrades, and options into the dataset, wherein the options are organized at a community, model, and selection level. Each option is assigned a unique identifying code 211, such as a QR code, to provide for efficiency.

System 201 further includes a buyer platform 213 accessible from a computing device 215, wherein the buyer platform provides a means for the buyer to make a plurality of selections of options. The buyer will have the ability to virtually make selections, and once the buyer is satisfied with their selection, the platform will generate a purchase order 217 and/or summary document 219. It should be appreciated that the generation of the purchase order will eliminate error and misunderstanding around selections, as there is not an employee putting together the purchase order. In some embodiments, the buyer will be prompted to approve and/or finalize the order to further assure accuracy.

Figure 3:
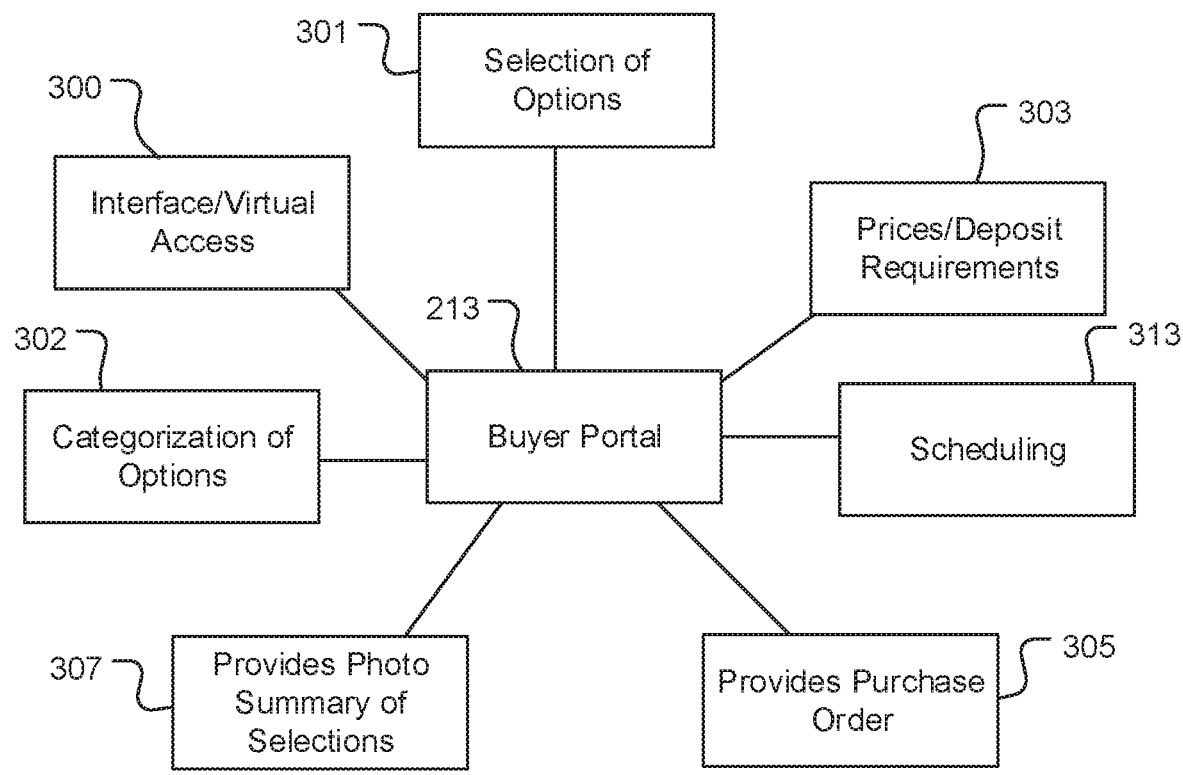
FIG. 3 is a simplified schematic of some of the features of a buyer platform of FIG. 2.

In FIG. 3, a simplified schematic depicts features of the buyer platform 213. These features include the use of an interface 300 to make the process of selection options a virtual experience for the buyer to make selections of options 301. The selection process can be based on categories 302, search criteria, price, packages, and the like. The selection process will further ensure that the buyer is aware of pries/deposit requirements 303 based on their selected options. Once the selection process is completed and finalized, the buyer will receive a purchase order 305 and a summary document 307. The summary document will provide photos of the home including the selections made by the customer. In some embodiments, the buyer platform can further include a scheduling feature 309 to provide for the buyer to schedule consultations and appointments.

Figure 4:
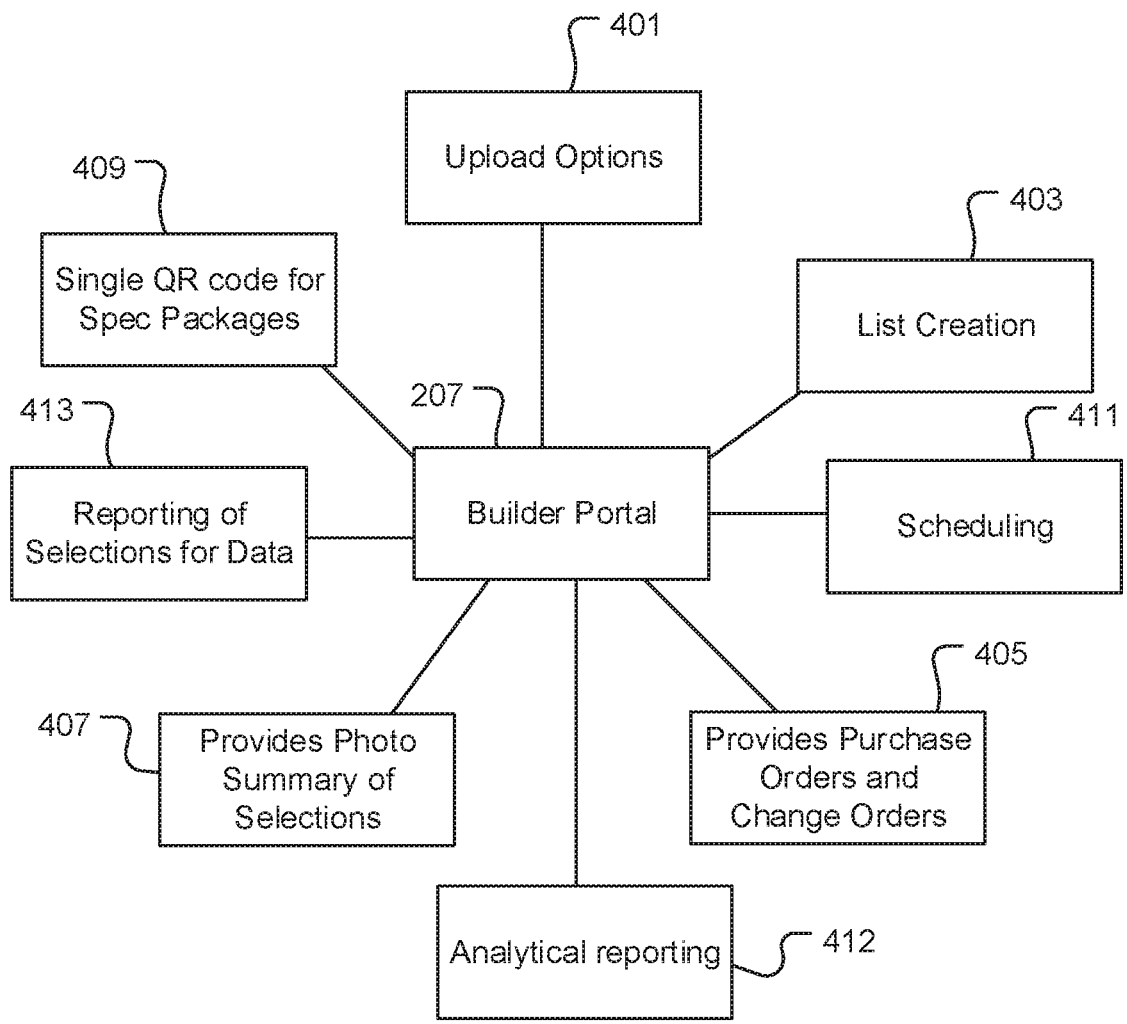
FIG. 4 is a simplified schematic of some of the features of a builder platform of FIG. 2.

In FIG. 4, a simplified schematic depicts features of the builder platform 207. The builder platform 207 allows for the builder to upload their available options 401 into the database. The builder can entirely control their lists 403 of available options, which can be categorized based on community, model, and selection.

The builder platform further provides the builder with the purchase order 405 and document summary 407 associated with the final purchase. The document summary 407 and/or purchase order 405 can have an associated identification code 409, which can be scanned and utilized by the builder to ensure accuracy when implementing the selected options. Further, scheduling 411 associated with design center management can be implemented through the platform.

An additional benefit associated with builder platform 207 is the ability to track 413 buyer preferences and statistics in order for improve management and option availability.

Further, the builder platform provides analytical reporting 412 based on the QR codes and how many times items are purchased in a community, region, division, and company wide. These reports can be visual graphs that provide tracking over various periods of time, such as 3 months, six months, annual, bi-annual, and the like. This feature gives builders information to help identify any design trends that are repetitive within the time period.

Figure 5:
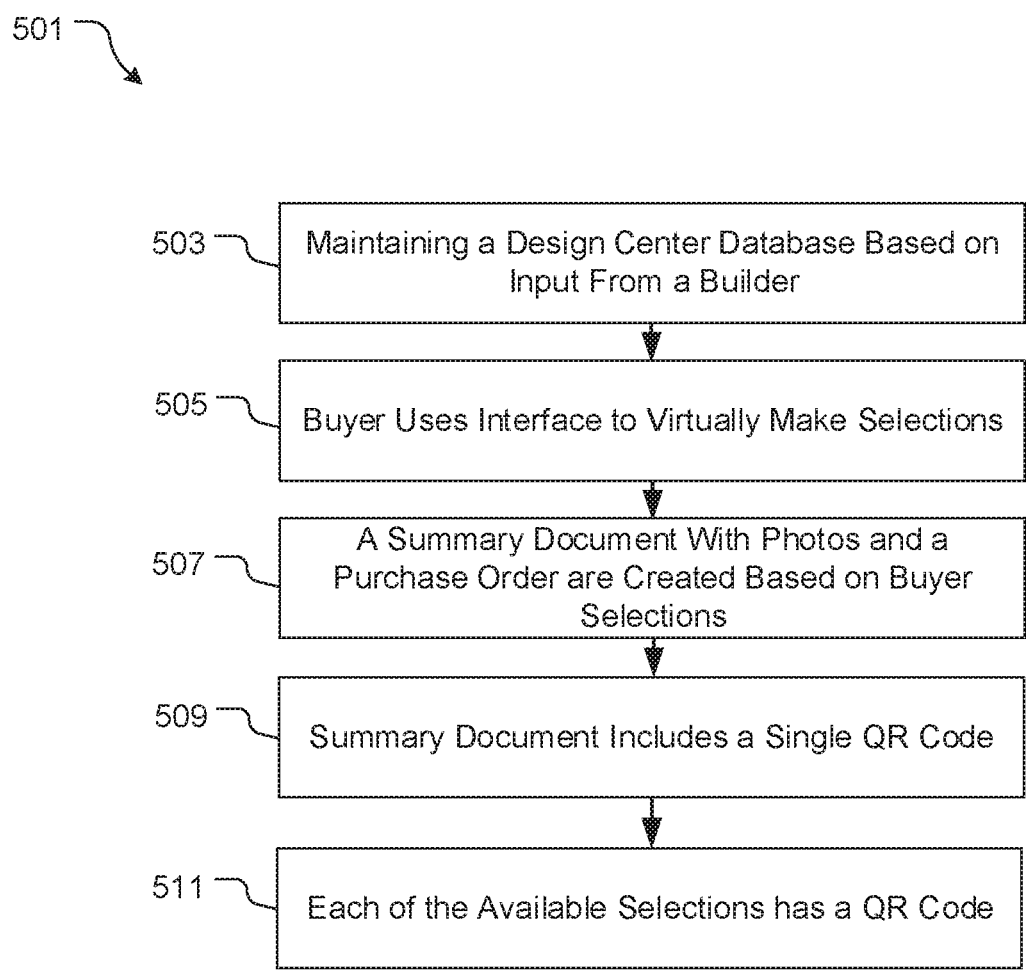
FIG. 5 is a flowchart of the method of use of the system of FIG. 2.

In FIG. 5, a flowchart 501 depicts a method associated with system 210. The method includes the creation of the database of options based on input from the builder, as shown with box 503. The buyer can then use the interface and buyer portal to make one or more selections, as shown with 505. Based on a completed buyer selection, a purchase order and/or summary document with a QR code is created, as shown with boxes 507, 509. The builder can then use the purchase order and/or summary document in order to implement the selections, wherein the options selected each have their own associated QR code, as shown with box 511.

The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. A method, performed by one or more processors, for automating design center product selection, the method comprising:
providing a design center having
a builder computing device with a platform incorporated thereon;
a database having data of a plurality of options received from a home builder, the database in data communication with the builder computing device;
a buyer interface accessible via a buyer computing device, the buyer interface having:
a selection portal configured to provide the buyer with options to browse items and make selections and upgrades on a home build;
a summary portal configured to generate a photo summary document of the home build with the selections and upgrades; and
a purchase order generation portal configured to generate a purchase order based on the selections and upgrades on the home build;
a plurality of QR codes, each of the QR codes are assigned to one of the plurality of options, the plurality of QR codes being in data communication with the database for tracking and recording information;
an analytical report providing data based on the information received by the plurality of QR codes, the analytical report including how many times items are purchased and one or more visual graphs that provide tracking over a predetermined period of time,
maintaining the design center database based on input from the builder, the design center database including the plurality of options available from the home builder, the database having the plurality of QR codes assigned to the plurality of options chosen by a buyer;
providing the buyer interface accessible from the buyer computing device, the buyer interface having access to the plurality of options;
receiving one or more selections from the buyer through the buyer interface, the one or more selections are added to a pending purchase;
creating a purchase order based on a finalized selection from the buyer of one or more of the plurality of options;
creating a summary document accessible to the buyer and to the builder, the summary document having selection photos of a home with the selected plurality of options; and
assigning the QR code to each of the plurality of options on the summary document, the QR code is further associated with the selected plurality of options on the summary document.

* * * * *